US012301215B2

(12) United States Patent
Hänsel et al.

(10) Patent No.: US 12,301,215 B2
(45) Date of Patent: May 13, 2025

(54) FAST ELECTRONIC SWITCH

(71) Applicant: Innomotics GmbH, Nuremberg (DE)

(72) Inventors: Stefan Hänsel, Erlangen (DE); Oliver Reimann, Erlangen (DE)

(73) Assignee: INNOMOTICS GMBH, Nuremberg (DE)

( * ) Notice: Subject to any disclaimer, the term of this patent is extended or adjusted under 35 U.S.C. 154(b) by 231 days.

(21) Appl. No.: 17/796,927

(22) PCT Filed: Jan. 25, 2021

(86) PCT No.: PCT/EP2021/051590
§ 371 (c)(1),
(2) Date: Aug. 2, 2022

(87) PCT Pub. No.: WO2021/156086
PCT Pub. Date: Aug. 12, 2021

(65) Prior Publication Data
US 2023/0056547 A1   Feb. 23, 2023

(30) Foreign Application Priority Data

Feb. 3, 2020   (EP) .................................... 20155104

(51) Int. Cl.
  *H03K 17/04*   (2006.01)
  *H03K 17/041*   (2006.01)
  *H03K 17/0814*   (2006.01)
(52) U.S. Cl.
  CPC ..... *H03K 17/041* (2013.01); *H03K 17/08148* (2013.01)

(58) Field of Classification Search
  CPC ...................... H03K 17/041; H03K 17/08148
  See application file for complete search history.

(56) References Cited

U.S. PATENT DOCUMENTS

| 2,398,587 | A | * | 4/1946 | McClellan | ............... H01C 3/02 338/63 |
| 2,858,350 | A | * | 10/1958 | Fritts | ........................ G01K 7/06 136/228 |
| 6,166,619 | A | | 12/2000 | Baiatu et al. | .................... 338/61 |
| 6,353,353 | B1 | | 3/2002 | Nakayama | .................... 327/382 |

(Continued)

FOREIGN PATENT DOCUMENTS

| CA | 106571615 A | 4/2017 | ............. H02H 3/087 |
| CN | 102640375 A | 8/2012 | ............. H02H 7/125 |

(Continued)

OTHER PUBLICATIONS

Search Report for International Application No. PCT/EP2021/051590, 11 pages, Apr. 23, 2021.

(Continued)

*Primary Examiner* — Daniel C Puentes
(74) *Attorney, Agent, or Firm* — Slayden Grubert Beard PLLC

(57) ABSTRACT

Various embodiments of the teachings herein include an electronic switch comprising: a semiconductor switch; and a series circuit. The series circuit is arranged parallel to the semiconductor switch and includes a first resistor, a capacitor, and a second resistor arranged in order R-C-R. The first resistor and the second resistor are arranged to create a bifilar resistor.

13 Claims, 8 Drawing Sheets

(56) References Cited

U.S. PATENT DOCUMENTS

| | | | | |
|---|---|---|---|---|
| 11,258,437 B2 | 2/2022 | Rupp | ............... | H03K 17/0814 |
| 2010/0328833 A1* | 12/2010 | Frisch | ............... | H01L 23/642 |
| | | | | 361/111 |
| 2010/0328975 A1 | 12/2010 | Hibino | ............... | 363/126 |
| 2012/0243282 A1 | 9/2012 | Marquardt | ............... | 363/132 |
| 2018/0170205 A1* | 6/2018 | Yoon | ............... | B60L 58/20 |
| 2021/0151345 A1* | 5/2021 | Liang | ............... | H10D 1/692 |

FOREIGN PATENT DOCUMENTS

| | | | | |
|---|---|---|---|---|
| CN | 103296016 A | | 9/2013 | ............... H01L 23/64 |
| CN | 109546672 A | | 3/2019 | ............... H02J 3/14 |
| CN | 109637892 A | * | 4/2019 | |
| DE | 4225724 C2 | | 4/1998 | ............... H01C 1/082 |
| DE | 19717715 A1 | | 10/1998 | ............... H03K 17/04 |
| DE | 19542162 C2 | | 11/2000 | ............... H01C 1/08 |
| EP | 2 259 419 | | 12/2010 | ............... H02M 7/48 |
| EP | 2 264 894 | | 12/2010 | ......... H03K 17/0814 |
| EP | 3 367 567 | | 8/2018 | ......... H03K 17/0814 |
| GB | 251034 A | | 4/1926 | ............... H01G 4/228 |
| JP | 10200051 A | | 7/1998 | ........... H01L 21/822 |
| JP | 2018133440 A | * | 8/2018 | |

OTHER PUBLICATIONS

Search Report for EP Application No. 20155104.1, 8 pages, Jul. 15, 2020.

Chinese Office Action, Application No. 202180012080.0, 8 pages, Oct. 17, 2024.

European Notice of Allowance, Application No. 21704414.8, 37 pages, Nov. 27, 2024.

* cited by examiner ed off and comprises a first resistor (4a), a capacitor (3) and a second resistor (4b), which are arranged in the order R-C-R, wherein the first and second resistor (4a, b) are jointly constructed as a bifilar resistor (4).

FAST ELECTRONIC SWITCH

CROSS-REFERENCE TO RELATED APPLICATIONS

This application is a U.S. National Stage Application of International Application No. PCT/EP2021/051590 filed Jan. 25, 2021, which designates the United States of America, and claims priority to EP Application No. 20155104.1 filed Feb. 3, 2020, the contents of which are hereby incorporated by reference in their entirety.

TECHNICAL FIELD

The present disclosure relates to electronic switches. Various embodiments include switches with at least one semiconductor switch that can be switched off and a series circuit arranged parallel to the semiconductor switch and which comprises a capacitor for receiving energy during a switch-off process.

BACKGROUND

Nowadays electrical energy is primarily supplied via alternating current networks. These have the advantage that different voltage levels may be produced with the aid of transformers. Different voltage levels may also be easily generated by way of semiconductors, which are commercially available ever more inexpensively, for DC networks, so precisely the energy supply via DC networks, in particular within industrial networks, is also particularly economical.

DC networks should reduce losses in future industrial plants, guarantee direct energy exchange between inverters, energy stores and loads and achieve increased robustness. In this case, for example small DC networks with different cable lengths can be operated between the various load outputs and feed-ins. The short cable lengths result in very low longitudinal inductance in the supply lines, so fault currents can have very steep current increases. Similarly, DC networks lack the reactance present in AC networks, which limits the maximum current of a short-circuit. This makes very fast fault recognition and switch-off necessary for the fault. Mechanical switches often cannot fulfil these requirements. For this reason, what are known as electronic switches with semiconductor switches are being introduced. These are also referred to as solid state breakers. These switches, in contrast to mechanical switches, are distinguished by particularly fast switching, typically in the order of magnitude of 100 ns.

A switching apparatus for disconnecting a current path is known from EP 3 367 567 A1. This document relates to a switching apparatus for disconnecting a current path of a DC network comprising source- and load-side inductance. The switching apparatus comprises at least two switching modules wired in series, wherein each of the switching modules comprises at least one controllable semiconductor switch element with which a series circuit comprising a resistor and a capacitor is connected in parallel.

SUMMARY

The teachings of the present disclosure include electronic switches. For example, some embodiments include an electronic switch (1), having a semiconductor switch (21) that can be switched off, a series circuit, which is arranged parallel to the semiconductor switch (21) that can be switched off and comprises a first resistor (4a), a capacitor (3) and a second resistor (4b), which are arranged in the order R-C-R, wherein the first and second resistor (4a, b) are jointly constructed as a bifilar resistor (4).

In some embodiments, the bifilar resistor (4) comprises at least one of the following materials: an iron alloy, in particular V4A steel; constantan; carbon.

In some embodiments, the first and second resistors (4a, b) are produced by means of punching or laser beam cutting.

In some embodiments, the bifilar resistor (4) is designed as a mechanical carrier for the capacitor (3).

In some embodiments, the first and second resistors (4a, b) each have the shape of a quadrilateral, in particular of a rectangle, wherein two mutually opposing edges are bent by 90° to one side, in particular with a cross-section with the shape [.

In some embodiments, the first and second resistors (4a, b) are placed together so as to be isolated by way of an insulation panel or insulation film (9) and are pressed together by means of screwed panels (53).

In some embodiments, the first and second resistors (4a, b) jointly have a cross-section with the shape ] [.

In some embodiments, the first and second resistors (4a, b) each have a meandering portion (6), wherein the meandering portions (6) are arranged relative to each other such that these meanders in turn form a bifilar arrangement.

In some embodiments, the first and second resistors (4a, b) are each L-shaped, wherein the two L-shapes are placed one inside the other in order to form the bifilar resistor (4).

In some embodiments, the first and second resistors (4a, b) can be screwed directly onto connectors of the semiconductor switch (21, 51) that can be switched off.

In some embodiments, the capacitor (3) is screwed directly onto the first and second resistors (4a, b).

As another example, some embodiments include a switching facility with a first number of electronic switches as described herein, which are connected in series with each other.

In some embodiments, one or more further electronic switch(es) (1) are connected antiserially to the first number of electronic switches (1), wherein in particular the number of electronic switches (1), which is assigned to a first current direction, is equal to the number of electronic switches (1), which is assigned to the other current direction.

As another example, some embodiments include a ship's network with one or more electronic switches (1) as described herein and/or one or more switching facilities as described herein.

As another example, some embodiments include a high-voltage direct current transfer network with at least one switching facility as described herein.

BRIEF DESCRIPTION OF THE DRAWINGS

The teachings of the present disclosure are further described and explained in more detail below with reference to the exemplary embodiments illustrated in the figures. In the drawings.

DETAILED DESCRIPTION

Figure 1:
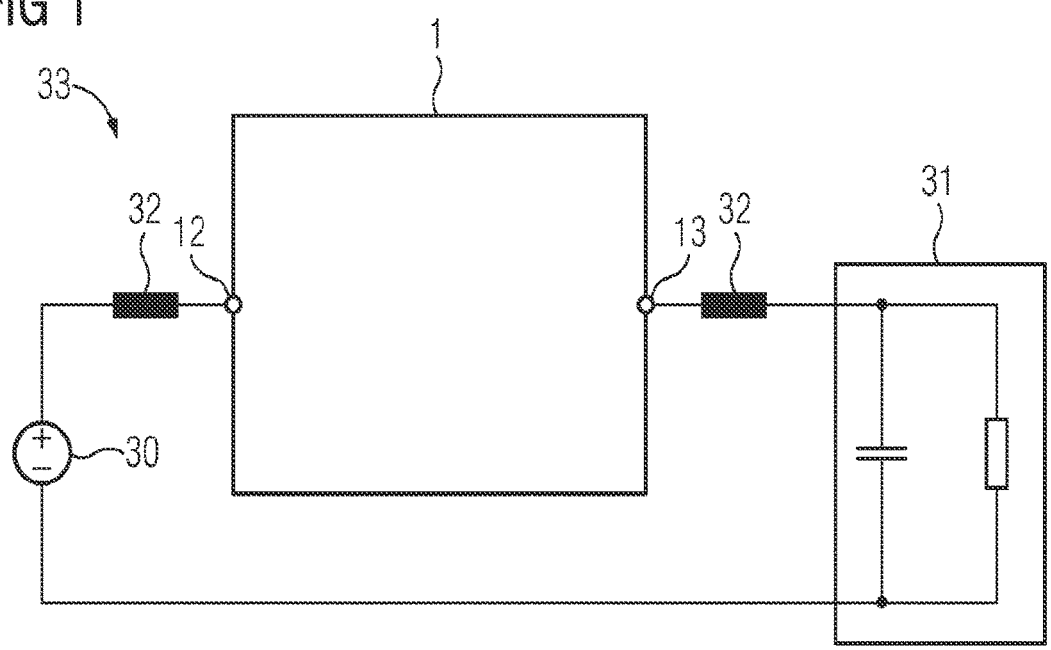
FIG. 1 shows a DC network with an electronic switch.

The electronic switches described herein comprise a semiconductor switch that can be switched off and a series circuit, which is arranged parallel to the semiconductor switch that can be switched off and a first resistor, a capacitor and a second resistor. The first and second resistor are jointly constructed as a bifilar resistor. The power semiconductor switch can be a switch, which can switch off a current in only one direction. This is suitable in particular for loads, which are not regenerative and therewith also result in current in only one direction. Similarly, it can be a power semiconductor switch that can be switched off, which can switch off a current in both directions.

The semiconductor switch that can be switched off is sensitive to voltage peaks, which occur during switching, in particular during switching-off, of the current. Due to the existing inductances in the DC network, for example owing to parasitic inductances of the cables, changes in current and specifically current interruptions result in high voltages, which then decrease partially over the semiconductor switch that can be switched off and can damage it or reduce its life. Due to the series circuit arranged in parallel and comprising capacitor and bifilar resistor, the semiconductor switch that can be switched off can be reliably protected against resulting overvoltages and voltage peaks.

A transition from the blocking into the conductive state of a switch is referred to as switching-on and a transition from the conductive into the blocking state of a switch is referred to as deactivating or switching-off. Depending on its current-voltage characteristic curve, part of the voltage resulting when switching-off the semiconductor switch that can be switched off decreases across the resistor, the other part across the capacitor. As a result, a voltage is established in the capacitor, which adds to the voltage of the resistor. The load current drops due to the applied counter voltage of the capacitor in accordance with equation $u(t)=L*di/dt$ and owing to the behavior of the capacitor with $i(t)=C*du/dt$ a counter voltage is increasingly built up across the capacitor. In any case a counter voltage is generated as a result, which is greater than the driving DC voltage since due to the current flow through the capacitor, a counter voltage is built up which expediently and reliably prevents the current flow after a certain time.

The construction described herein creates an electronic switch, in particular for DC connections, in which the resistor, which is arranged in series with the parallel capacitor, is particularly low-inductance. As a result, an electronic switch is created which can also commutate high short-circuit currents quickly in the capacitor and can therefore switch-off these short-circuit currents particularly quickly.

Use of the electronic switch in DC networks at medium voltage level, in the region of a few kV voltage and with currents, which lie, at least in the case of a short-circuit, in the region of a few kA is useful. The switch can also be used in DC networks at low voltage level, however, less than 1,500 V DC voltage, therefore. In some embodiments, it is an electronic DC switch, therefore.

For the low-inductance construction, the first and the second resistors, which jointly form the bifilar resistor, are arranged electrically on either side of the capacitor, in other words the order of first resistor, capacitor, second resistor. With this construction the first and second resistor are physically arranged side by side such that the direction of the electric current is mutually opposed in both resistors. Consequently, the resulting magnetic fields are largely cancelled and the entire component, the bifilar resistor therefore achieves a very low inductance.

In some embodiments, the bifilar resistor can comprise an iron alloy, in particular V4A steel. V4A steel means CrNiMo steel in this disclosure. These iron alloys are non-magnetic on the one hand and on the other hand have a much higher specific resistance compared to copper or aluminum, and this clearly facilitates construction of the bifilar resistor. In some embodiments, the bifilar resistor can comprise other resistance alloys, such as constantan, as the material, in particular can be composed of the material.

As a result, the bifilar resistor can have a thickness in the millimeter range without obtaining an inadequate electric resistance. As a result, a suitably stable connection with the semiconductor switch and the capacitor can be achieved. A bifilar resistor made of copper would, by contrast, be thin like a film since its width cannot be made very small without in turn increasing the inductance.

The two resistors, which jointly form the bifilar resistor, can be produced by means of punching. Punching represents a simple, inexpensive and flexible form of production which can also be used if the resistors are used as busbars and have to bear the mechanical load of the capacitor connectors, the material thickness lies in the range of mm therefore.

The first and second resistors can each have the shape of a rectangle, wherein two mutually opposing edges are bent by 90° to one side. As a result, the cross-section of an angled C or a square bracket [ is produced for each of the resistors. In some embodiments, the two resistors are arranged with their backs to each other, so a cross-section with the shape ] [ is produced. The bent end pieces serve for fastening to the semiconductor switch and the capacitor, while the backs that face each other constitute the actual resistor. With sufficient thickness of the material, sufficient mechanical carrying capacity therefore, the bifilar resistor, in addition to the electric connection, can also constitute the sole mechanical connection between the semiconductor switch and the capacitor.

In some embodiments, the bifilar resistor still has a cross-section with the shape ] [, although in a top view it no longer has a rectangular shape. Instead the resistors taper in the direction of the capacitor, so in a top view the two resistors have the shape of a trapezoid or a rectangle with a connected trapezoid.

In some embodiments, the resistors have an L-shaped cross-section. In order to form the bifilar resistor the two resistors are placed one inside the other and thus form a double-walled L-shape. One arm of this L-shape comes to rest on the connectors of the semiconductor switch and the other arm protrudes accordingly from the surface of the semiconductor switch and serves for connection of the capacitor. If the capacitor has an elongate cylindrical shape, with this shape of the resistors its cylindrical axis is located parallel to the surface of the semiconductor switch, instead of protruding perpendicularly from it as in the case of the preceding alternatives with the cross-section with the shape ] [. This alternative is consequently compact.

Since all electric line connections again introduce characteristic inductances into the circuit, parallel to the bifilar resistor the electronic switch comprises exactly one single semiconductor switch that can be switched off. If the resistor simultaneously represents the direct electrical connection between the semiconductor switch and the capacitor, then practically all electric lines, which still have an inductance and take care of high voltages during the switch-off process and could delay the current commutation, are omitted in the commutation circuit comprising semiconductor switch, resistor and capacitor. A low-inductance commutation circuit may be created therewith, which even with only two semiconductor switches parallel to the bifilar resistor and capacitor can be achieved only with great difficulty. Even if the electronic switch contains only exactly one semiconductor switch, a plurality of examples of the electronic switch can be assembled to form an overall switch. For example, a plurality of electronic switches can be connected in series.

In some embodiments, the switch can comprise exactly one power semiconductor module. The power semiconductor module is the currently customary structural form of power semiconductors and comprises one or more individual semiconductor switch(es) in a shared housing. For example two serial, two parallel or two antiserial or two antiparallel semiconductor switches can be arranged in such a module. Since the electric line connections within such a module are short, and therewith low-inductance, a very low-inductance switch can thus be created even if the module itself contains more than one semiconductor switch. For example, a low-inductance bidirectional switch can also be created in this way.

In some embodiments, the switch comprises a plurality of power semiconductors in a plurality of power semiconductor modules, with the power semiconductor modules being connected serially or antiserially.

Commercially available semiconductor switches that can be switched off can usually switch-off only one current in one direction. Typical representatives of such semiconductor switches that can be switched off are IGBTs or MOSFETS. If when using such semiconductor switches that can be switched off there is a desire to be able to switch-off currents in both directions by way of the switch, two of these semiconductor switches that can be switched off are used. Both polarities of the current can be switched off by the electronic switch thereby.

The switches are arranged in such a way that a current from a first connector of the electronic switch to a second connector of the electronic switch can be conducted and switched-off by a first one of the two semiconductor switches that can be switched off and a current from the second connector of the electronic switch to the first connector of the electronic switch can be conducted and switched off by a second of the two semiconductor switches that can be switched off. For the case where a diode, which enables the reverse conductance for the semiconductor switch that can be switched off, is arranged parallel to the switching element of the semiconductor switch the two semiconductor switches are arranged in a series circuit. Since the switching elements of the two semiconductor switches can each conduct and switch-off a current with different polarity this series circuit is also referred to as antiserial. The two semiconductor switches are rotated in respect of collector and emitter or drain and source connectors. For bidirectional operation two or more of the electronic switches can be antiserially connected therefore, with typically an even number of electronic switches being used, of which one half is assigned to one current direction and the other half to the other current direction.

In some embodiments, the first and second resistors can be placed together so as to be isolated by way of an insulation panel or insulation film and be pressed together by means of screwed panels. A precondition for this is that the resistors have planar regions, which may be pressed together. These are advantageous since they enable the resistors to be arranged close together, and this enables a low inductance. During switching-off of the semiconductor switch and commutation of a substantial current, for example a short-circuit current in the kA range, a substantial mechanical force occurs between the two resistors, which drives the resistors apart. An increased distance between the resistors increases the inductance, however. It is advantageous therefore if the resistors preserve a small distance as a result of being pressed together.

In some embodiments, the first and/or second resistor(s) can have a meandering portion. In other words, in the affected resistor there is a portion in which the material is shaped such that the current path is meandering. The shaping of the material can be achieved, for example, by suitable punching. For example gaps can be introduced thereby or with other means into the material of the resistor, which gaps force the current path into a meandering shape. If a meandering shape, along which the current has to flow, is introduced into a rectangular surface, which conducts the current, the current path is then lengthened as a result and its cross-section simultaneously reduced. As a result, the electrical resistance to the free current flow in the rectangular surface is much increased. With a given physical size of the resistor and a minimum thickness, which is demanded by the mechanical strength, this in turn enables a resistor to be adjusted in the range required for the electronic switch. The meandering shape is expediently arranged such that the currents are in turn cancelled by the meanders. The currents in the two panels therefore flow in exactly the opposite direction in order to practically cancel the total magnetic field. The size of the total magnetic field is in turn responsible for the remaining inductance.

In some embodiments, the first and second resistor(s) can be screwed directly to connectors of the semiconductor switch that can be switched off. The capacitor can in turn be directly screwed onto the first and second resistors. This produces a very low-inductance connection.

In some embodiments, the electronic switch can be a medium voltage DC switch or a low voltage DC switch. As a low voltage DC switch it can be used, for example, in ships' networks at voltages around 500 V to 1,500 V. As a medium voltage DC switch it can be used at voltages from 1,500 V DC to more than 10 kV DC. The low inductance, and therewith high switching speed, in the isolation of partial networks, which are used, for example, on ships, may be useful if they have to be quickly isolated in the event of a fault.

In some embodiments, the switch can also be used for in an HVDC application (high-voltage direct current transfer) in a "multiple" series circuit, in other words a series circuit of a large number of electronic switches. DC voltages of up to 1,000 kV DC are then achieved in this connection.

FIG. 1 shows a DC network 33, which is also referred to as a direct voltage network. From a DC source 30, also referred to as a direct voltage source, this supplies a load 31 with power. This load can be for example a drive with a power converter, wherein the power converter is connected by its intermediate circuit via an electronic switch 1 to the DC source 30.

An electronic switch 1 with a first connector 12 and a second connector 13 is connected into the electric line of the DC network 33. The electronic switch 1 can switch-off the current flowing in the electric line. Depending on the type of electronic switch 1 it can switch-off a current in only one direction or in both directions between the first and the second connectors 12, 13.

The electric lines between DC source 30 and load 31 can assume quite different properties in respect of their inductive behavior. This inductive behavior is illustrated with the aid of inductances 32 in the representation. These can assume very low values since there is no transformer present which has a current-limiting effect with its inductance. On the other hand, the inductances can also assume very high values owing to greater cable lengths.

For the electronic switch 1 this produces the requirements that, owing to the low inductance and the accompanying great changes in current, in particular in the case of a short-circuit, it should exhibit very fast switching behavior, so unreliably high currents, as are produced, for example, in the case of a short-circuit, can be safely controlled. Furthermore, the electronic switch 1 also has to be capable of reliably functioning in the case of high inductances. High inductances with identical currents store substantially more energy. This energy has to be stored or dissipated when a short-circuit is switched-off since otherwise overvoltages can occur at the power switches.

Figure 2:
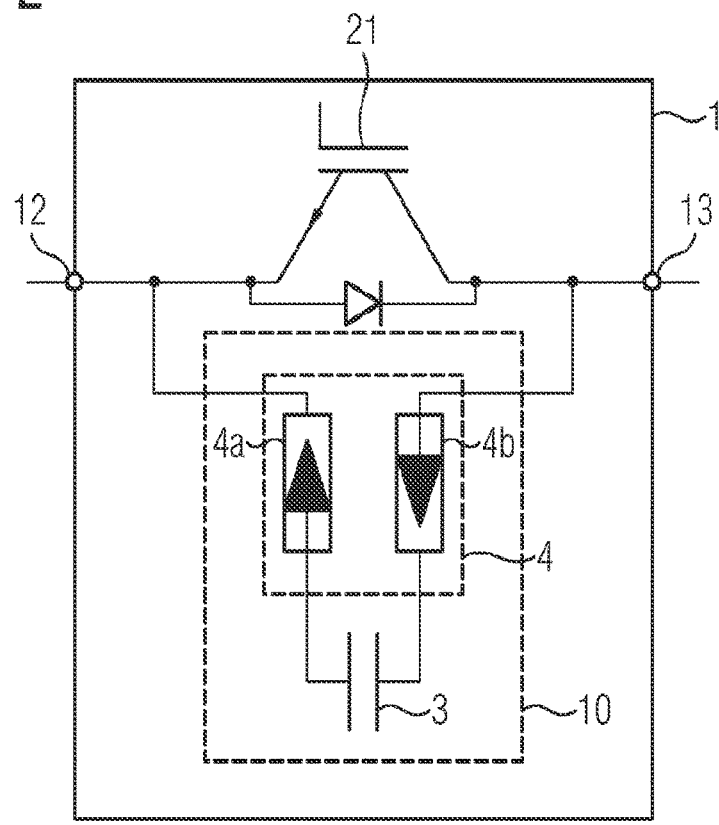
FIG. 2 shows an exemplary embodiment of an electronic switch with low inductance resistor.

FIG. 2 shows an exemplary embodiment of an electronic switch 1 with an overvoltage limitation. Arranged parallel to a semiconductor switch 21 that can be switched off is a first series circuit 10. This first series circuit 10 has a capacitor 3 and two partial resistors 4a, b, which are arranged in a series circuit. If the semiconductor switch 21 that can be switched off switches off the current between the connectors 12, 13 of the electronic switch 1, the current driven through the inductances can be commutated at the first series circuit 10. The capacitor 3 and the resistors receive the energy from the inductances. As a result, the resulting voltages at the switch 1, which are produced from the large reduction in current due to switching-off, are reduced and damage to the switch avoided.

Figure 3:
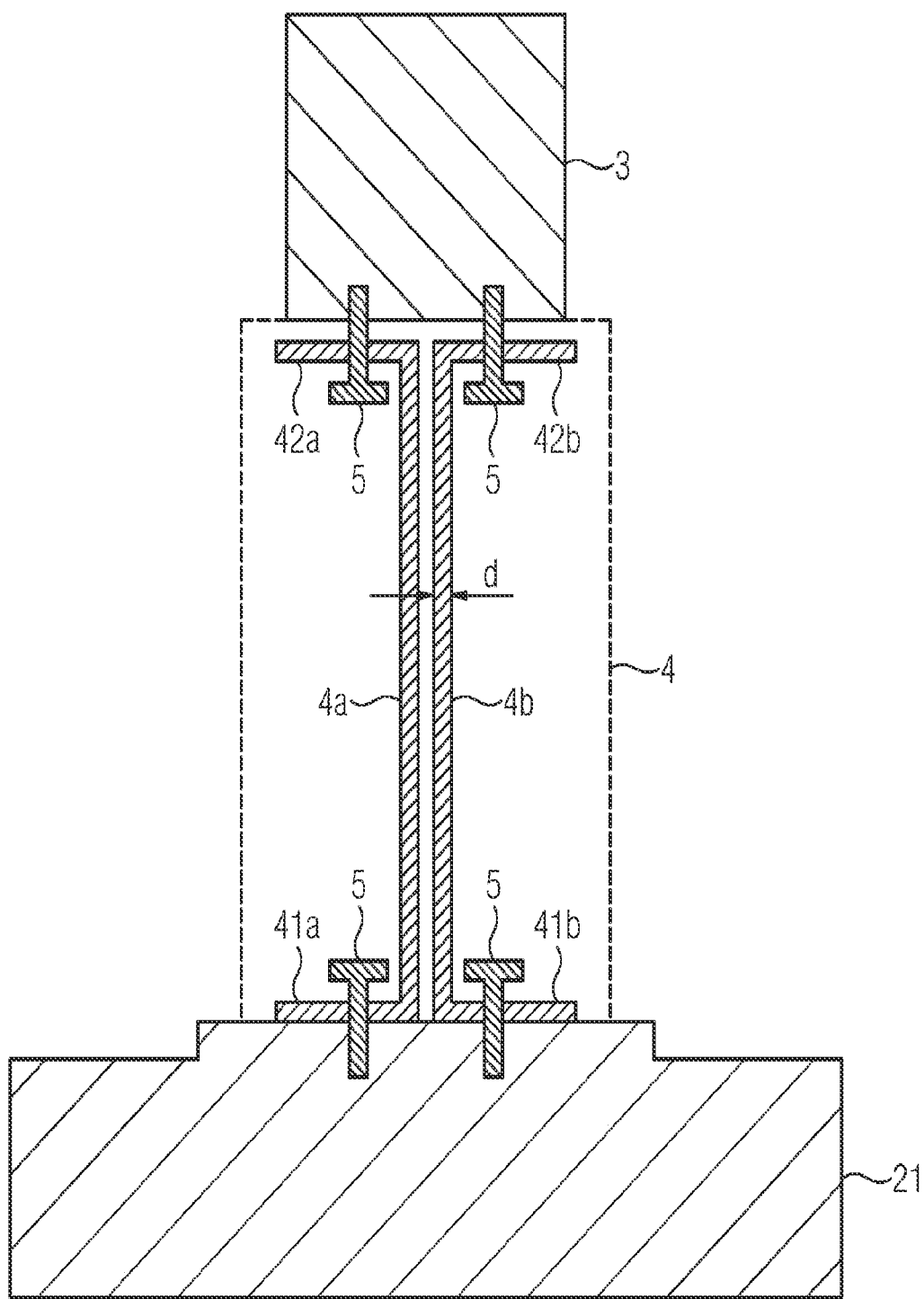
FIG. 3 shows a cross-section of the electronic switch.

As indicated in FIG. 2 and shown more clearly in FIG. 3 the two partial resistors 4a, b are arranged so as to be spatially adjacent in this case. The arrangement is such that a current flowing through the partial resistors 4a, b as indicated by arrows in FIG. 2, is in opposite directions. As a result, the magnetic fields caused by the flowing current are largely cancelled. The partial resistors 4a, b jointly form a resistor 4 therefore which is bifilar. The resistor 4 is consequently very low-inductance and the current in the series circuit 10, and thus to the capacitor 3, can consequently be commutated very quickly. Since the currents in both resistors 4a, b have to be in opposite directions in order to achieve a low-inductance resistor 4, of the two resistors 4a, 4b one each has to be arranged upstream and the other downstream of the capacitor 3 in the series circuit 10. In other words, the order R-C-R has to be adhered to in the series circuit 10.

One possibility for the construction of the bifilar resistor 4 is illustrated in the sectional image in FIG. 3. The two partial resistors 4a, b are shown in cross-section and each have the shape of an angled C or a square bracket [. Both partial resistors 4a, b are arranged with the backs of this shape to each other, so the shape of two square brackets ] [ pointing away from each other is produced in the cross-section shown in FIG. 3. Each of the partial resistors 4a, b is attached at one end region 41a, 41b by a screwed connection 5 to a contact surface of the semiconductor switch 21. The other end region 42a, 42b respectively is connected by a screwed connection 5 to the capacitor 3. In conjunction with a V4A steel as the material for the resistor 4 a mechanically stable construction is produced in which the capacitor 3 is supported by the resistor 4. The thickness d of the resistor 4 is in the millimeter range, ideally between 0.5 mm and 3 mm.

In other exemplary embodiments other materials can be used for the partial resistors 4a, b, for example the resistance material constantan. Non-metallic materials such as carbon can also be used. The thickness d of the partial resistors 4a, b can be greater or smaller than the above-mentioned values.

Figure 4:
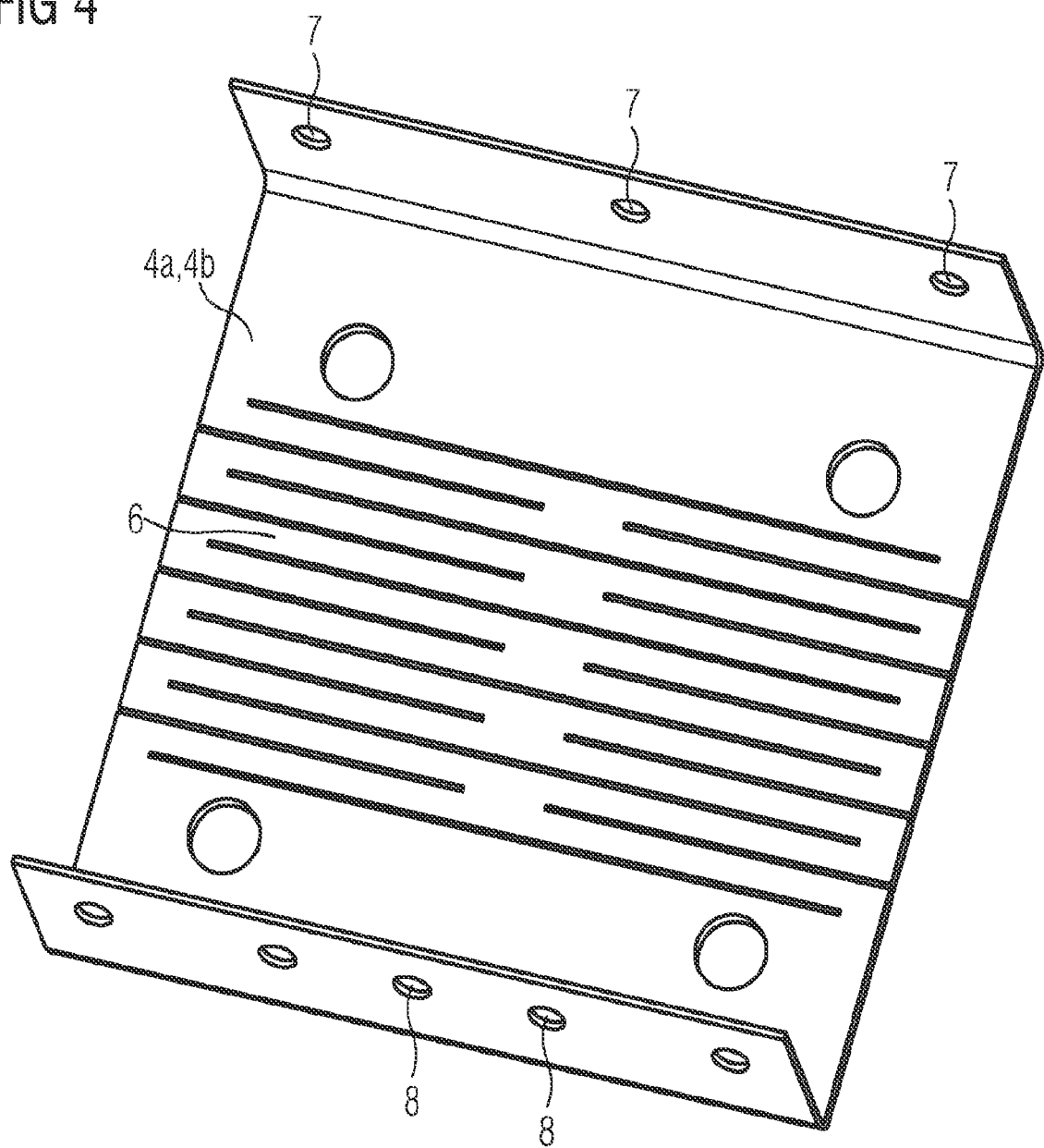
FIG. 4 shows a three-dimensional view of a partial resistor of the low-inductance resistor.

FIG. 4 shows a three-dimensional view of one of the partial resistors 4a, b. The resistor 4a, b produced by punching comprises a meandering structure 6 in a central region. In this meandering structure 6 the electric current is forced onto a meandering path and consequently the conductor length is considerably increased while at the same time the conductor width is reduced. The meandering structure 6 increases the electrical resistance of the resistor 4a, b overall therefore. This is advantageous in order to adjust the desired electric resistor from between 0.1 Ohm and 0.5 Ohm. Without the meandering structure 6 this would require such a low material thickness that the mechanical stability would be more difficult to achieve. FIG. 4 shows, moreover, holes 7, which serve for the screw connection with the semiconductor switch 21 and holes 8 for the connection with the capacitor 3. The size of the back of the resistor 4a, 4b is preferably between 10 cm×10 cm and 20 cm×20 cm.

Figure 5:
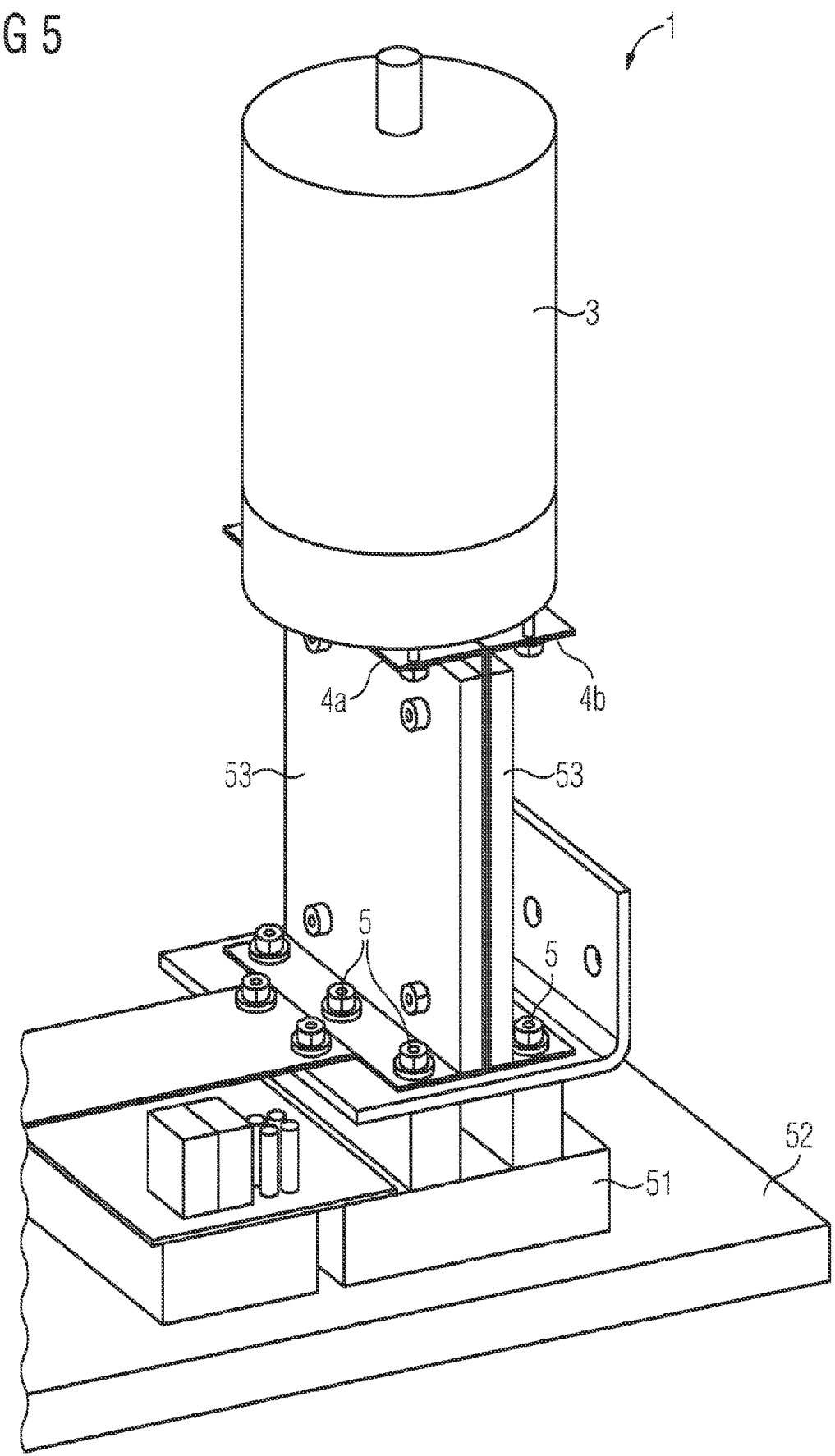
FIG. 5 shows a three-dimensional view of the electronic switch.

FIG. 5 shows a complete construction of an electronic switch 1 in a three-dimensional view. The electronic switch 1 comprises a semiconductor switch module 51, which is arranged on a cooler 52. Arranged on the top side of the semiconductor switch module 51 is the resistor 4 and on this in turn the capacitor 3. When the current is switched off by the electronic switch 1 a high current flow in the resistor 4 is commutated in a short time. As a result, a substantial mechanical force is generated on the partial resistors 4a, b whose direction is such that the partial resistors 4a, b are pressed apart. The distance between the partial resistors 4a, b has to be small, however, in order to obtain the low-inductance construction. The two partial resistors 4a, b are therefore pressed together by way of screwed plastic panels 53, with an insulating film 9 being arranged between the resistors 4a, 4b. This ensures that the mechanical construction is retained even during the switch-off process.

Figure 6:
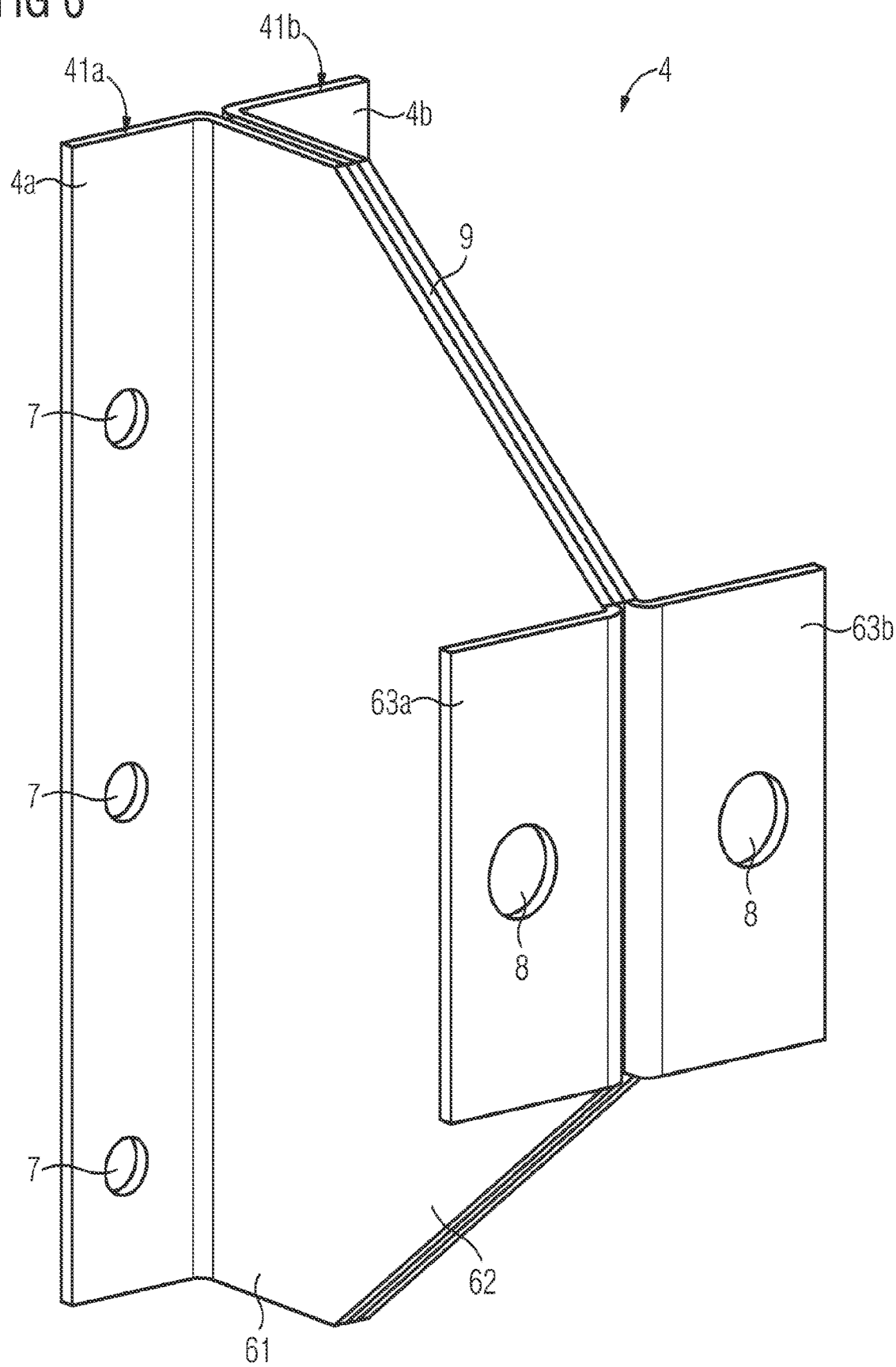
FIGS. 6 and 7 show three-dimensional views of alternative shapes for the partial resistors.

FIG. 6 shows an alternative construction of the resistor 4. The shape of the partial resistors 4a, 4b is changed in this case. As in the case of the shape illustrated in FIG. 5, the partial resistors have a first end region 41a, 41b, which is suitably shaped for attachment on the semiconductor switch module 51 and has holes 7. Adjoining this end region 41a, 41b is a rectangular region 61, which abuts a trapezoidal region 62. The partial resistors 4a, 4b taper in this trapezoidal region in the direction of the second end region 42a, 42b, which consequently has a reduced width and in each case only one hole 8 for the connection of the capacitor 3 in the case of each of the partial resistors 4a, 4b. As is the case with all of these resistors 4 the partial resistors 4a, 4b are isolated by the insulating film 9, which is shaped analogously to the partial resistors 4a, 4b, likewise tapers therefore.

The tapering shape of the partial resistors 4a, 4b in FIG. 6 increases the electric resistance of the partial resistors 4a, 4b. Nevertheless it is advantageous to also provide a meandering shape in the case of these partial resistors 4a, 4b in order to bring the electric resistance into the range of between 0.1 Ohm and 0.5 Ohm, which is expedient for the operation of the electronic switch.

Figure 7:
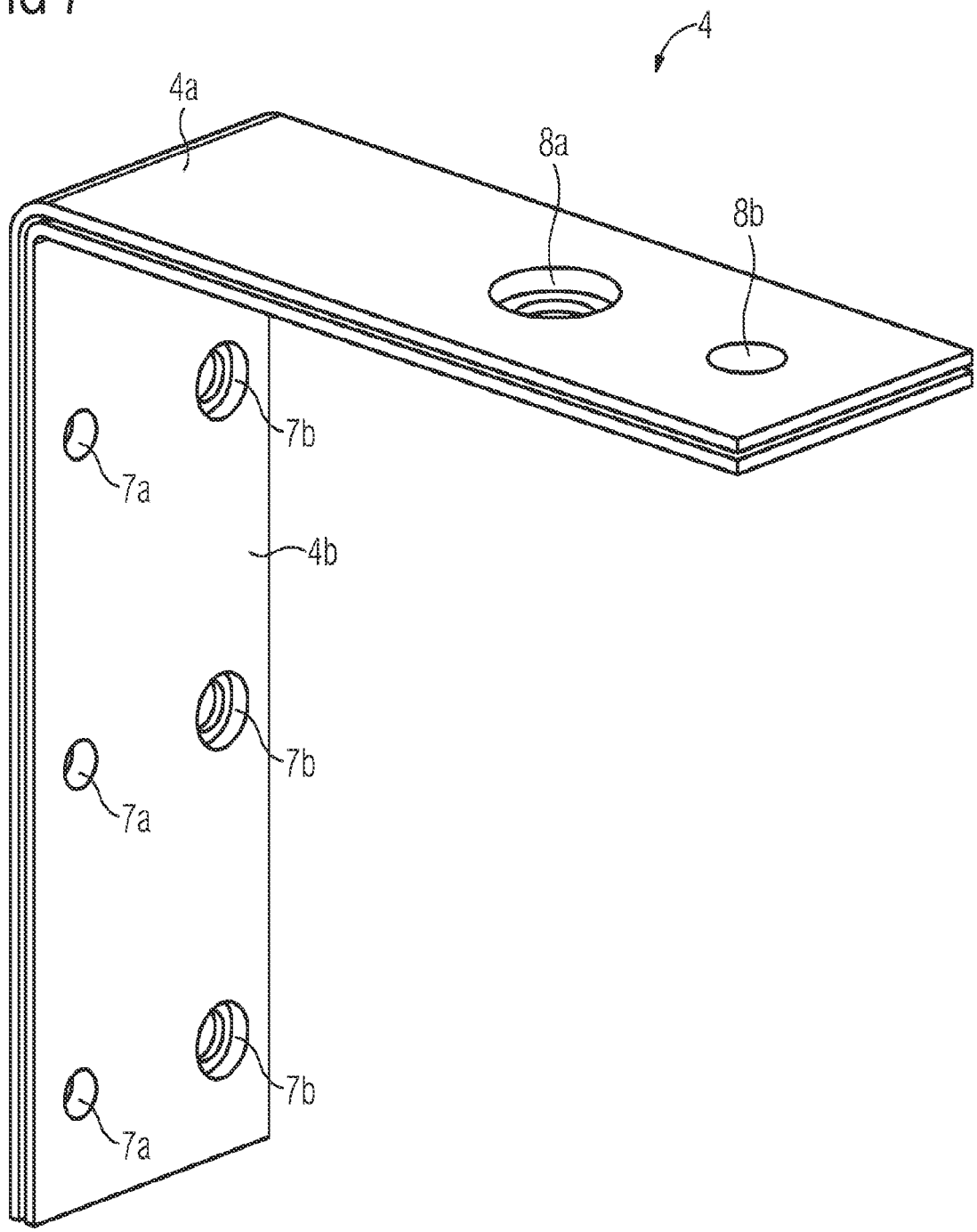

FIG. 7 shows a further alternative construction of the resistor 4. The shape of the partial resistors 4a, 4b has changed in this case. While in the case of the previously described shapes of the partial resistors 4a, 4b in cross-section the shape of two square brackets ] [ was achieved, the shape in FIG. 7 is an LL shape, in other words the cross-section corresponds to two L-shapes placed one inside the other, with one of the partial resistors 4a, 4b forming the outer L and the second of the partial resistors 4a, 4b forming the inner L. A first leg of the L-shapes serves for connection to the semiconductor switch module 51 and in turn has holes 7a, b. Since the partial resistors 4a, 4b have to rest on each other, the holes 7a, b, differ in order to permit on one side the connection of the outer partial resistor 4a to the holes 7b and on the other side the connection of the inner partial resistor 4b to the holes 7a.

The second leg forms the busbar to the capacitor 3 and in the direction of the end has holes 8a, b for screw connection of the capacitor 3. The holes 8a, b are in turn of different configurations in order to contact the inner partial resistor 4b once and the outer partial resistor 4a once. The resistor 4 in FIG. 7 also has an insulating film 9 arranged between the partial resistors 4a, 4b for electric isolation of the partial resistors 4a, 4b.

Figure 8:
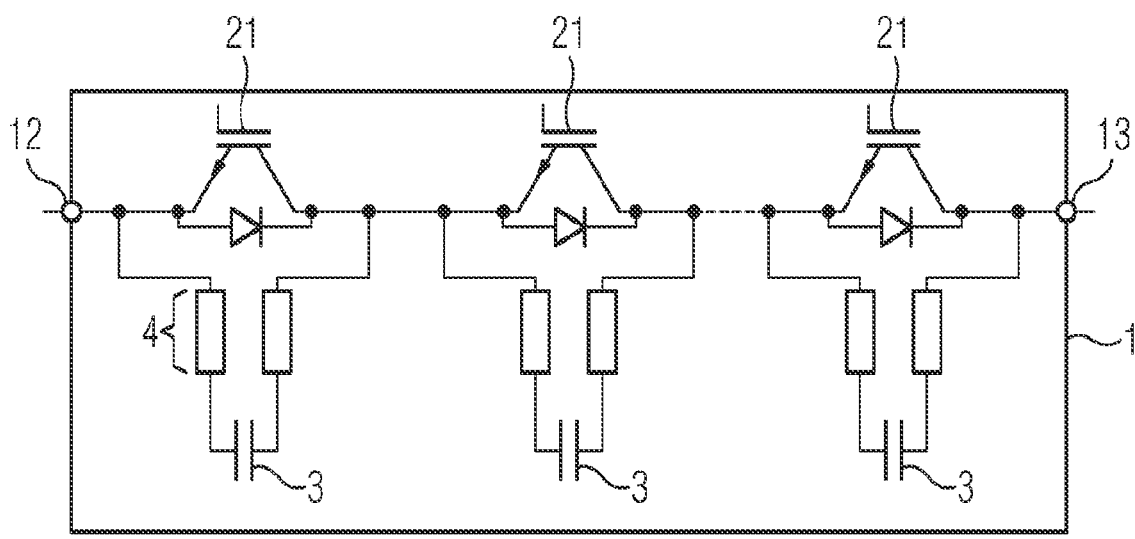
FIG. 8 shows an electronic switch with a plurality of switching blocks.

In order to satisfy the various requirements of the DC network 33 it is possible to connect in series two or more of the semiconductor switches 21 to their assigned series circuit comprising the partial resistors 4a, 4b and the capacitor 3. FIG. 8 shows an electronic switch 1 of this kind. For instance a plurality of semiconductor switches 21 is not connected in series therefore and in turn parallel thereto a capacitor 3. Instead the entire block comprising semiconductor switch 21 and series circuit comprising the partial resistors 4a, 4b and the capacitor 3 is multiplied and connected in series to each other. The very low-inductance connection of the resistor 4 to the respective semiconductor switch 21 is obtained hereby. If a plurality of semiconductor switches 21 were connected parallel to the capacitor 3, additional electrical conductors or conductor bars would be necessary in the commutation circuit, which would increase the inductance.

The connection between a block, which is formed by a semiconductor switch 21 and the assigned series circuit comprising the partial resistors 4a, 4b and the capacitor 3, and the next such block, can, by contrast, be highly inductive without particular disadvantages for the electronic switch 1.

Figure 9:
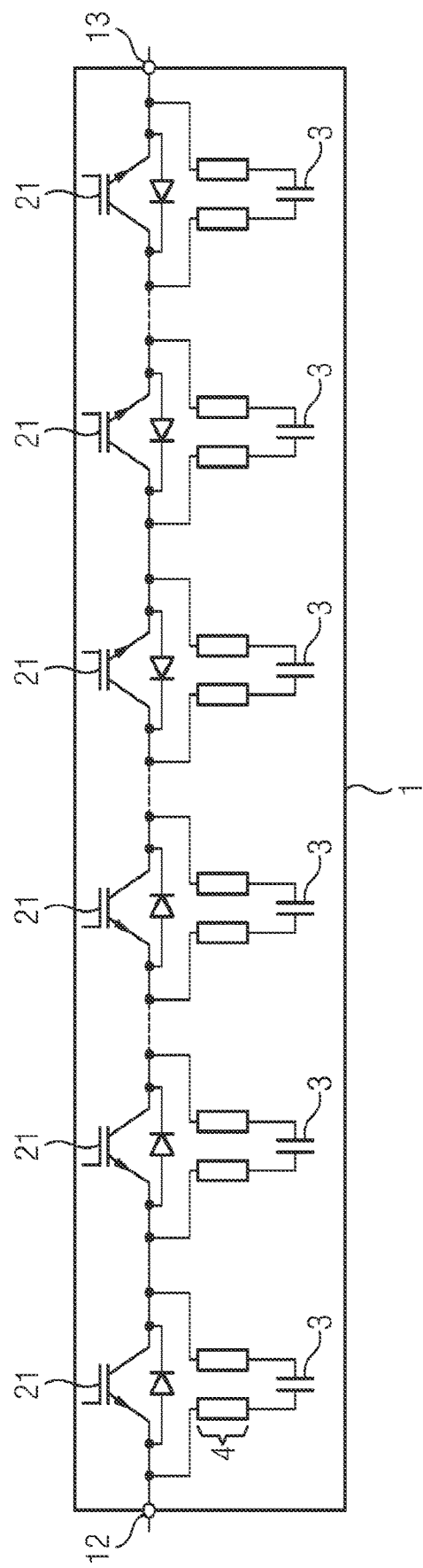
FIG. 9 shows a bidirectional electronic switch.

To create a bidirectional electronic switch 1 and thus be able to switch-off current in both directions, the electronic switch 1 which can be seen in FIG. 8 can be supplemented by a number of further blocks comprising semiconductor switches 21 with their assigned series circuit comprising the partial resistors 4a, 4b and the capacitor 3, with the semiconductor switches 21 being antiserially arranged in relation to the existing semiconductor switches 21. Preferably, the same number of blocks is used for both current directions in this case. FIG. 9 shows an electronic switch 1 of this kind. For example, an electronic switch 1 formed in this way can have eight blocks for a first current direction and eight further blocks for the other current direction.

To summarize, an electronic switch may include a, in particular exactly one, semiconductor switch that can be switched off, wherein the electronic switch has a capacitor and a resistor, wherein the capacitor and the resistor are arranged in a series circuit, wherein the series circuit comprising the capacitor and the resistor is arranged parallel to the semiconductor switch that can be switched off. In order to improve the electronic switch, in particular in respect of its switching behavior, the resistor may comprise two partial resistors and is constructed as a bifilar resistor, wherein the elements are arranged in the series circuit in the order partial resistor, capacitor, partial resistor.

LIST OF REFERENCE CHARACTERS 1 electronic switch
12, 13 connectors
31 load
33 DC network
32 electric line inductance
30 DC voltage source
3 capacitor
4 resistor
4a, 4b partial resistors
21 semiconductor switch
5 screw connection
41a, b end region
42a, b end region
d thickness
6 meandering region
7, 8 holes
52 cooling system
51 semiconductor switch module
53 plastic panels
61 rectangular region
62 trapezoidal region
63a, b end region
7a, 7b holes
8a, 8b holes
9 insulating film

What is claimed is:

1. An electronic switch comprising:
   a semiconductor switch; and
   a series circuit arranged parallel to the semiconductor switch, the series circuit including a first resistor, a capacitor, and a second resistor arranged in order R-C-R;
   wherein the first resistor and the second resistor each have a longitudinal axis and the respective longitudinal axis of the first resistor is parallel to and side-by-side with disposed adjacent the respective longitudinal axis of the second resistor;
   wherein a current flowing through the series circuit flows in a first direction along the longitudinal axis of the first resistor generating a first magnetic field and in an opposite direction along the longitudinal axis of the second resistor generating a second magnetic field;
   wherein a net magnetic field created by the first magnetic field and the second magnetic field is substantially zero.

2. The electronic switch as claimed in claim 1, wherein the first resistor comprises at least one material selected from the group consisting of: an iron alloy, V4A steel, constantan, and carbon.

3. The electronic switch as claimed in claim 1, wherein each of the first resistor and the second resistor is produced by punching or laser beam cutting.

4. The electronic switch as claimed in claim 1, wherein the first resistor and the second resistor combine to serve as a mechanical carrier for the capacitor.

5. The electronic switch as claimed in claim 1, wherein the first resistor and the second resistor each have a quadrilateral shape, wherein two mutually opposing edges are bent by 90° to one side.

6. The electronic switch as claimed in claim 5, wherein the first resistor and the second resistor are placed together so as to be isolated by way of an insulation panel or insulation film and are pressed together by means of screwed panels.

7. The electronic switch as claimed in claim 5, wherein the first resistor and the second resistor together form a cross-section with the shape ] [.

8. The electronic switch as claimed in claim 1, wherein the first resistor and the second resistor each have a meandering portion.

9. The electronic switch as claimed in claim 1, in which the first resistor and the second resistor are each L-shaped, wherein the two L-shapes are placed one inside the other.

10. The electronic switch as claimed in claim 1, wherein the first resistor and the second resistor are screwed directly onto connectors of the semiconductor switch.

11. The electronic switch as claimed in claim 1, wherein the capacitor is screwed directly onto the first resistor and the second resistor.

12. A switching facility comprising:
a plurality of electronic switches connected in series with each other;
wherein each electronic switch comprises a semiconductor switch; and a series circuit arranged parallel to the semiconductor switch, the series circuit including a first resistor, a capacitor, and a second resistor arranged in order R-C-R;
wherein the first resistor and the second resistor each have a longitudinal axis and the respective longitudinal axis of the first resistor is parallel to and side-by-side with the respective longitudinal axis of the second resistor;
wherein a current flowing through the series circuit flows in a first direction along the longitudinal axis of the first resistor generating a first magnetic field and in an opposite direction along the longitudinal axis of the second resistor generating a second magnetic field; and
wherein a net magnetic field created by the first magnetic field and the second magnetic field is substantially zero.

13. The switching facility as claimed in claim 12, further comprising at least one further electronic switch connected antiserially to the plurality of electronic switches.

* * * * *